United States Patent [19]

Pearsall

[11] 4,228,453

[45] Oct. 14, 1980

[54] (III) PLANE GALLIUM ARSENIDE IMPATT DIODE

[75] Inventor: Thomas P. Pearsall, Paris, France

[73] Assignee: Thomson-CSF, Paris, France

[21] Appl. No.: 916,820

[22] Filed: Jun. 16, 1978

[30] Foreign Application Priority Data

Jun. 21, 1977 [FR] France ................... 77 18952

[51] Int. Cl.³ .............. H01L 29/04; H01L 29/20; H01L 29/90
[52] U.S. Cl. .......................... 357/60; 357/13; 357/61
[58] Field of Search ............... 357/13, 60, 3, 1, 61

[56] References Cited

U.S. PATENT DOCUMENTS 3,457,473  7/1969  Okada et al. ................ 357/60

OTHER PUBLICATIONS

Kobayashi et al., Fujitsu Sci. & Tech. J., vol. 12, No. 3, Sep., 1976, pp. 107–119.
Omori et al., 1973, Conf. on Electron Device Techniques, N.Y. (May 1–2, 1973), pp. 17–20.
Sze, Physics of Semiconductor Devices, (Wiley, N.Y.), 1969, pp. 59–60.

*Primary Examiner*—William D. Larkins
*Attorney, Agent, or Firm*—Cushman, Darby & Cushman

[57] ABSTRACT

In an avalanche diode of gallium arsenide, e.g. an IMPATT diode, the optimization of the coefficient of ionization by impact in the case of impacts initiated by holes when the electrical field propels the carriers along the axis of 1 1 1 of the monocrystal, has been utilized. The structure comprises a substrate of Ga As with two large faces perpendicular to the axis 1 1 1 and layers obtained by epitaxial growth from one of these large faces. Arrangements are made to ensure that the electrical field is as parallel as possible to this crystalline axis. The improvement in efficiency is of the order of 20%.

3 Claims, 2 Drawing Figures

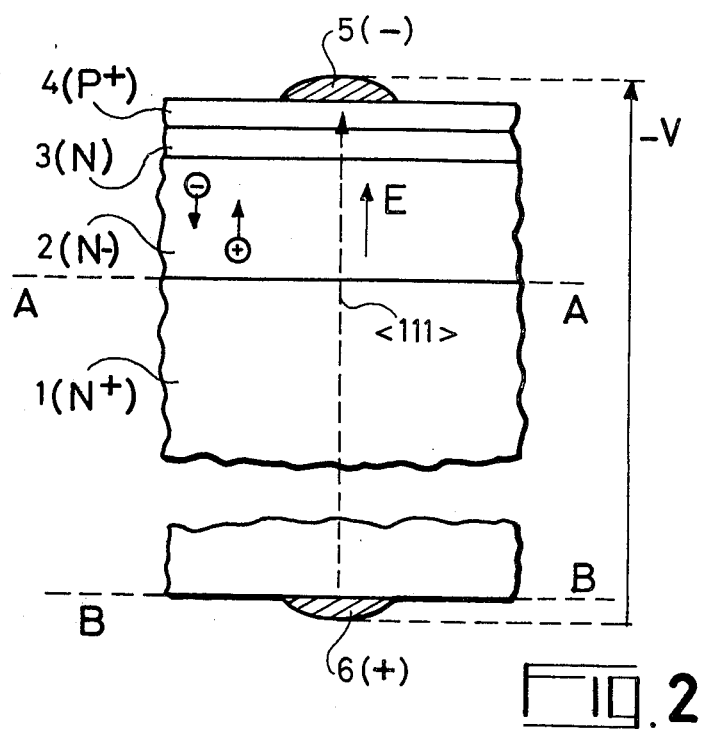

(III) PLANE GALLIUM ARSENIDE IMPATT DIODE

This invention relates to avalanche diodes, in particular of the "IMPATT" (impact avalanche transit time) type combining the phenomenon of ionization by impact and utilization of the transit time of the charge carriers.

For a given semiconducting structure and geometry of such a diode, the power output of the microwave generator is a decreasing function of the mean voltage of the avalanche region. Accordingly, it is advantageous to reduce this voltage, particularly by increasing the impact ionization coefficient. This coefficient is defined by the number of secondary carriers (electrons or holes) generated per centimeter of path in the electrical field of an impact initiating carrier.

It is known that the impact ionization coefficient differs according to whether the impact-initiating charge carrier is an electron or a hole. By contrast, less is known of the influence exerted by the orientation of the electrical field in relation to the axes of symmetry of the monocrystal on account of the extremely delicate experimental conditions under which the impact ionization coefficients are measured. However, it is estimated that, for any monocrystalline semiconductor material, there is at least one optimal direction of the electrical field in relation to the axes of symmetry of the monocrystal.

The present invention is based on an experimental determination of the impact ionization coefficient in a monocrystalline structure of gallium arsenide.

According to the invention, there is provided an avalanche diode structure comprising a semiconducting substrate layer of gallium arsenide forming with said substrate a monocrystalline assembly and metallic deposits bordering said assembly and forming the electrodes of a diode, the surfaces separating the layers from one another and surfaces of said electrodes being perpendicular to the axis $<1\,1\,1>$ of said monocrystalline assembly in such a way that the electrical field generated by a biassing voltage applied to the electrodes is parallel to said axis $<1\,1\,1>$.

The invention will be better understood and other features thereof will become apparent from the following description in conjunction with the accompanying drawings, wherein:

FIG. 2 shows a diode structure according to the invention.

Figure 1:
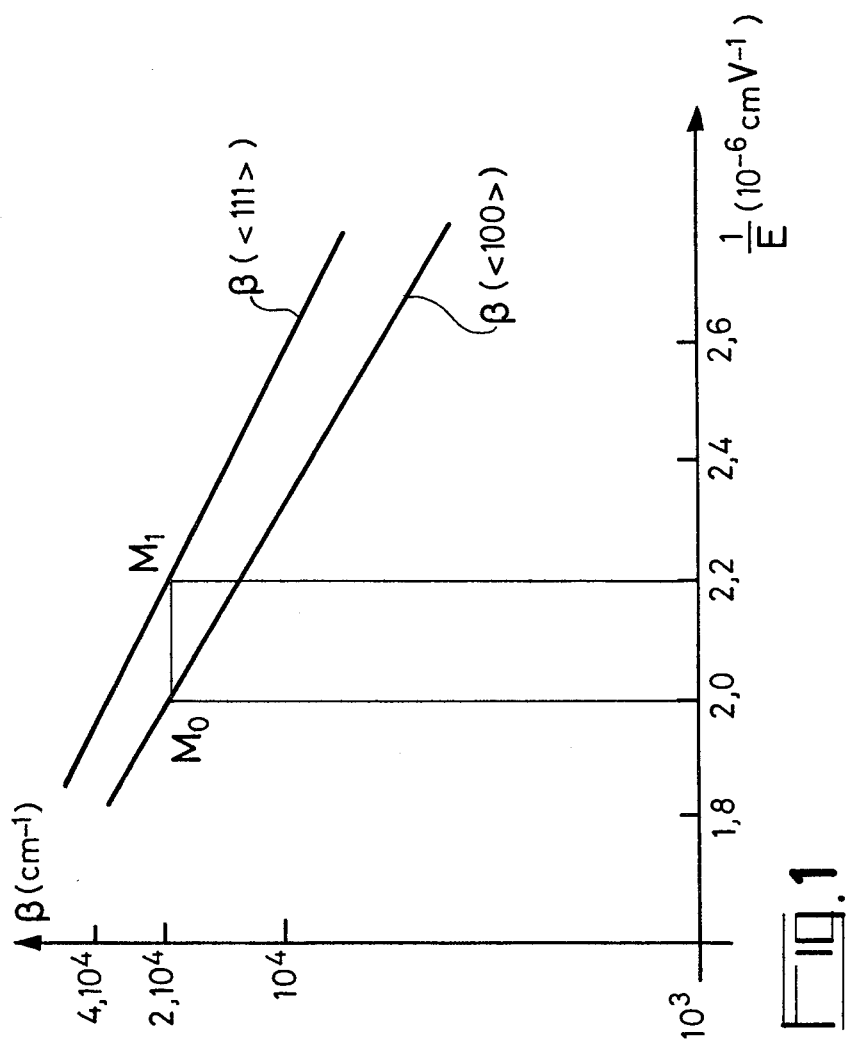
FIG. 1 is an explanatory graph relating to the impact ionization coefficient in gallium arsenide.

The symbols $\alpha$ and $\beta$ generally denote the impact ionization coefficients associated with the two charge carriers of opposite sign, namely the electrons ($\alpha$) and the holes ($\beta$).

Experimentally, these coefficients were measured using the avalanche phenomenon in a photodiode comprising either a PN junction (for the coefficient $\alpha$) or an NP junction (for the coefficient $\beta$), these junctions being obtained by expitaxial growth of a monocrystalline substrate of gallium arsenide. This substrate was cut in such a way as to make the P and N (or N and P) layers grow from a large face of the substrate perpendicular to one of the axes of symmetry of the monocrystal and to the general direction of the electrical field in the semiconductor medium.

The invention uses the experimental results observed in the following two cases:

First Case: The electrical field is oriented along the axis $<1\,0\,0>$; this case corresponds to that of the generality of avalanche diodes using gallium arsenide; in addition, it is known that the efficiency of these diodes is considerably greater than that of avalanche diodes using silicon or germanium.

Second case: The electrical field is oriented along the axis $<1\,1\,1>$.

On the one hand, it was found that the impact ionization coefficient is greater for the holes than for the electrons ($\beta > \alpha$) in the second case, irrespective of the intensity of the electrical field, whereas in the first case $\beta < \alpha$ beyond a certain intensity of the electrical field.

On the other hand, it was found that the impact ionization coefficient for the holes is greater in the second case than in the first case for the same intensity of the electrical field, irrespective of the values of that field.

This last result is illustrated in FIG. 1 where the inverse of the intensity of the electrical field in megavolts per centimeter, i.e. $1/E$ ($10^{-6}$ cm $V^{-1}$) is recorded on the abscissa and the coefficient $\beta$ (holes) on the ordinate. Two straight lines with negative slopes are obtained, passing respectively through the points:

$M_o$ (first case, axis 1 0 0) corresponding to a coefficient of $2.10^4$ for $1/E=2$, i.e. $E=500,000$ V/cm;

$M_1$ (second case, axis 1 1 1) corresponding to a coefficient of $2.10^4$ for $1/E=2.2$, i.e. $E=454,000$ V/cm.

Accordingly, in a diode where the electrical field works in the direction of the axis 1 1 1, the ionization coefficient obtained is the same as that obtained in a diode where the electrical field works in the direction of the axis 1 0 0, although the electrical field has respective values of 454,500 V/cm and 500,000 V/cm. The reduction in the electrical field is of the order of 10% in the case of the axis $<1\,1\,1>$. This results in an increase in efficiency of the order of twice that value in a structure of the "high-low" type of which one example is shown in FIG. 2.

A substrate 1 of gallium arsenide is shown in partial section in FIG. 2. It has been cut into an N+ monocrystalline block (doping concentration in atoms per cc: $1.10^{19}$) so that it has two large faces (lines AA and BB in the drawing) perpendicular to the axis $<1\,1\,1>$ of the monocrystal. The following layers were grown on the face represented by the line AA by successive expitaxies of suitably doped gallium arsenide:

an N--doped layer 2 ($1.10^{14}$ at/cc);
an N-doped layer 3 ($1.10^{17}$ at/cc);
a p+-doped layer 4 ($1.10^{19}$ at/cc).

It is known that, by vitue of a property common to all methods of expitaxial growth (liquid phase, gas phase, molucular beam), the crystalline orientation of the layer is identical with that of the substrate.

The thickness of the layer 2 is of the order of 1000 to a few times 1000 Angstroms. The total thickness of the layers 2 and 3 is determined in dependence upon the oscillation frequency required for the avalanche diode and is of the order of a few microns in the X band.

Production of the avalanche diode is completed by the deposit of metallic electrodes 5 and 6 respectively on the face BB of the substrate 1 and on the free face of the layer 4.

A structure such as this is favorable to the working of the invention in practice, because, at the beginning of the avalanche phenomenon, the charge carriers responsible for initiating impact ionization are not only electrons emanating from the electrode 5 (at the potential $-V$) and passing through the $P^+$ layer, but also holes emanating from the electrode 6 (at the potential $+V$) through the N layers. Now, it has been determined by experiments that the coefficient of ionization by impacts initiated by holes is higher than that associated with the electrons where the electrical field E has an orientation $<1\ 1\ 1>$. That means that a PN structure is still more favorable that an NP structure.

The invention is applicable to a complementary structure in which the P-dopings are replaced by N-dopings and vice versa for the reasons which have just been explained in connection with the electrons and the holes responsible for initiating impacts.

The invention is also applicable to all the other avalanche diode structures based on gallium arsenide.

What we claim is:

1. An avalanche diode structure including a semiconducting substrate, layers of gallium arsenide forming with said substrate a monocrystalline assembly and metallic deposits bordering said assembly and forming the electrodes of a diode, the surface separating the layers from one another and the surfaces of said electrodes being perpendicular to the axis $<1\ 1\ 1>$ of said monocrystalline assembly in such a way that the electrical field generated by a biasing voltage applied to the electrode is parallel to said axis $<1\ 1\ 1>$ said diode comprising between said electrodes, an $N^+$-doped substrate, a first layer with $N^-$-type doping, a second layer with N-type doping and a third layer with $P^+$-type doping.

2. An avalanche diode structure including a semiconducting substrate, layers of gallium arsenide forming with said substrate a monocrystalline assembly and metallic deposits bordering said assembly and forming the electrodes of a diode, the surface separating the layers from one another and the surfaces of said electrodes being perpendicular to the axis $<1\ 1\ 1>$ of said monocrystalline assembly in such a way that the electrical field generated by a biasing voltage applied to the electrodes is parallel to said axis $<1\ 1\ 1>$ said diode comprising between said electrodes, a substrate with $P^+$-type doping, a first layer with $p^-$-type doping, a second layer with P-type doping and a third layer with $N^+$-type doping.

3. An avalanche diode structure including a semiconducting substrate, layers of gallium arsenide forming with said substrate a monocrystalline assembly and metallic deposits bordering said assembly and forming the electrodes of a diode, the surface separating the layers from one another and the surfaces of said electrodes being perpendicular to the axis $<1\ 1\ 1>$ of said monocrystalline assembly in such a way that the electrical field generated by a biasing voltage applied to the electrodes is parallel to said axis $<1\ 1\ 1>$, said layers including a first layer doped with an impurity of one conductivity type, a second layer doped with an impurity of the same conductivity type having a higher concentration than the impurity of the first layer, and a third layer doped with an impurity of the opposite conductivity type, the doping concentrations in atoms per cubic centimeter being respectively as follows: $1.10^{19}$ at/cc for the substrate; $1.10^{14}$ at/cc for the first layer; $1.10^{17}$ at/cc for the second layer; $1.10^{19}$ at/cc for the third layer.

* * * * *